United States Patent
Miyajima

(10) Patent No.: US 11,183,706 B2
(45) Date of Patent: Nov. 23, 2021

(54) LITHIUM-ION SECOND BATTERY CONTROLLER FOR REDUCING CHARGING LOSS WHILE PREVENTING DETERIORATION FROM LITHIUM DEPOSITION

(71) Applicant: TOYOTA JIDOSHA KABUSHIKI KAISHA, Toyota (JP)

(72) Inventor: Takayuki Miyajima, Nagoya (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 300 days.

(21) Appl. No.: 16/364,323

(22) Filed: Mar. 26, 2019

(65) Prior Publication Data

US 2019/0305367 A1 Oct. 3, 2019

(30) Foreign Application Priority Data

Mar. 27, 2018 (JP) .............................. JP2018-059177

(51) Int. Cl.
| | |
|---|---|
| *H01M 10/0525* | (2010.01) |
| *G01R 31/378* | (2019.01) |
| *B60L 53/62* | (2019.01) |
| *B60L 58/12* | (2019.01) |
| *G01R 31/382* | (2019.01) |
| *H01M 10/44* | (2006.01) |
| *H02J 7/00* | (2006.01) |

(52) U.S. Cl.
CPC ......... *H01M 10/0525* (2013.01); *B60L 53/62* (2019.02); *B60L 58/12* (2019.02); *G01R 31/378* (2019.01); *G01R 31/382* (2019.01); *H01M 10/44* (2013.01); *H02J 7/007* (2013.01)

(58) Field of Classification Search
CPC ............. H01M 10/0525; H01M 10/44; G01R 31/382; G01R 31/378; H02J 7/007; B60L 53/62; B60L 58/12
USPC ........................................................ 320/127
See application file for complete search history.

(56) References Cited

U.S. PATENT DOCUMENTS

| | | | |
|---|---|---|---|
| 2011/0127958 A1 | 6/2011 | Ishishita et al. | |
| 2017/0070061 A1* | 3/2017 | Barsukov | ................. H02J 7/00 |
| 2017/0203660 A1* | 7/2017 | He | ......................... B60L 58/14 |
| 2017/0234930 A1 | 8/2017 | Lee et al. | |

(Continued)

FOREIGN PATENT DOCUMENTS

| | | |
|---|---|---|
| JP | 2013-110885 A | 6/2013 |
| JP | 2015-230886 A | 12/2015 |
| JP | 2016-197545 A | 11/2016 |

(Continued)

*Primary Examiner* — Nathaniel R Pelton
(74) *Attorney, Agent, or Firm* — Sughrue Mion, PLLC

(57) ABSTRACT

A controller for controlling a charging current to a lithium-ion secondary battery controls the charging current so that lithium expected to dissolve after a stop of charging is permitted to deposit on an anode of the lithium-ion secondary battery. For example, the controller controls the charging current so that the charging current does not exceed a predetermined upper limit value. If a predetermined permission condition is satisfied, the controller permits the lithium expected to dissolve after the stop of charging to deposit on the anode of the lithium-ion secondary battery by permitting the upper limit value to become larger than a Li deposition limit value in a predetermined permission period.

7 Claims, 9 Drawing Sheets

(56) References Cited

U.S. PATENT DOCUMENTS

2018/0316195 A1* 11/2018 Verbrugge ............ H01M 4/587
2019/0229378 A1* 7/2019 Zhang .................. G01R 31/367

FOREIGN PATENT DOCUMENTS

| JP | 2016-197546 A | 11/2016 |
| KR | 1020170023583 A | 3/2017 |
| WO | 2010/005079 A1 | 1/2010 |

* cited by examiner

LITHIUM-ION SECOND BATTERY CONTROLLER FOR REDUCING CHARGING LOSS WHILE PREVENTING DETERIORATION FROM LITHIUM DEPOSITION

This nonprovisional application is based on Japanese Patent Application No. 2018-059177 filed on Mar. 27, 2018 with the Japan Patent Office, the entire contents of which are hereby incorporated by reference.

BACKGROUND

Field

The present disclosure relates to a controller for a lithium-ion secondary battery, and a vehicle.

Description of the Background Art

In a lithium-ion secondary battery, lithium serves as a charge carrier. Lithium is inserted in the anode active material during charging, and is removed from the anode active material during discharging. When charging and discharging are repeated, lithium (metallic lithium) may deposit on the anode of the lithium-ion secondary battery. The deposition of lithium on the anode of the lithium-ion secondary battery (hereinafter also simply referred to as "lithium deposition") more easily occurs as the charging current to the lithium-ion secondary battery is increased. The lithium deposited on the anode causes deterioration in performance (e.g. battery capacity) of the lithium-ion secondary battery.

WO 2010/005079 discloses a technique of restricting the charging current to a lithium-ion secondary battery for preventing the above-described lithium deposition. This technique restricts the charging current to the lithium-ion secondary battery, thereby preventing lithium deposition on the anode of the lithium-ion secondary battery.

SUMMARY

As described above, deterioration in battery performance can be prevented by restricting the charging current to the battery so that lithium will not deposit on the anode of the lithium-ion secondary battery (hereinafter also simply referred to as a "battery"). The restriction of the charging current to the battery, however, leads to an increase in charging loss. When energy (e.g. regenerative electric power) is available for supply to the battery, the restriction of the charging current to the battery would restrict charging of the battery, thus increasing the charging loss.

The present disclosure has been made to solve the above problem. An object of the present disclosure is to reduce the charging loss while preventing deterioration in battery performance due to the lithium deposition.

A controller for a lithium-ion secondary battery of the present disclosure (hereinafter also referred to as a "battery controller") is configured to control the charging current to the lithium-ion secondary battery. The battery controller of the present disclosure is configured to control the charging current so that lithium expected to dissolve after a stop of charging is permitted to deposit on the anode of the lithium-ion secondary battery.

The lithium deposited on the anode of the battery (hereinafter also referred to as "deposited lithium") basically remains on the anode surface. However, the inventor of the present application has found that the deposited lithium can be dissolved under a specific condition. According to the experiments conducted by the inventor of the present application, lithium can deposit solubly, rather than becoming insolubilized upon depositing. The deposited lithium is inactivated (insolubilized) by changing in morphology (deposit morphology) of the lithium after the deposition. Accordingly, the lithium that has deposited solubly can be dissolved before being inactivated.

The battery controller of the present disclosure is based on the above-described finding. The battery controller of the present disclosure controls the charging current so that lithium expected to dissolve after a stop of charging is permitted to deposit on the anode of the battery. Thus, the restriction of the charging current is relaxed compared to when the charging current is restricted not to permit any lithium deposition. Specifically, the charging current can be large enough to permit occurrence of lithium deposition. Such relaxation of the restriction of the charging current can increase the chance of charging and prolong the charging time, thus reducing the charging loss.

The above-described charging current is large enough to permit occurrence of lithium deposition but is small enough to prevent the deposited lithium from becoming inactivated. The above-described battery controller permits the charging current to be a level such that the deposited lithium will not be inactivated (e.g. such that the current-applying time will not be too long). The lithium that has deposited with such a charging current is dissolved after a stop of charging. Accordingly, when the next charging is started, lithium (metallic lithium) does not remain on the anode surface of the battery. Therefore, the battery controller can prevent deterioration in battery performance due to lithium deposition.

The battery controller may include a control device configured to control the charging current so that the charging current does not exceed a predetermined upper limit value (hereinafter referred to as a "charging restriction value"), and a setting device configured to set the charging restriction value using the maximum value (hereinafter referred to as a "Li deposition limit value") of the charging current that does not cause deposition of lithium on the anode of the lithium-ion secondary battery. The control device may be configured to, if a predetermined permission condition is satisfied, permit the lithium expected to dissolve after the stop of charging to deposit on the anode of the lithium-ion secondary battery by permitting the charging restriction value to become larger than the Li deposition limit value in a predetermined permission period.

Such a battery controller can restrict the charging current not to generate lithium deposition by controlling the setting device to set the charging restriction value to smaller than or equal to the Li deposition limit value. Further, by appropriately setting the permission condition and the permission period, the control device can appropriately relax the above-described restriction.

The permission condition may be satisfied if the state of charge (SOC) of the lithium-ion secondary battery is lower than a predetermined SOC value (hereinafter referred to as a "permitted SOC"). The permitted SOC is not less than 90% and not more than 100%. The SOC represents the quantity of charge remaining and is expressed in, for example, the percentage (0 to 100%) of the current quantity of charge to the quantity of charge in the full charge state.

The deposited lithium, when dissolved, becomes lithium ion and returns into the anode. However, when the SOC of the battery is too high (when the battery is nearly fully charged), the anode may not have capacity enough to receive the lithium ion. Based on this knowledge, the above-described configuration makes it possible to relax the restriction only when the SOC of the battery is lower than the permitted SOC (in particular, an SOC selected from the range of not less than 90% and not more than 100%).

If the above-described permission condition is employed, the control device may be configured to stop charging at the timing at which the permission period ends, and configured not to perform charging during a period (hereinafter referred to as a "pause period") from the timing of the stop of charging (hereinafter referred to as a "pause starting point") until a predetermined time (hereinafter referred to as "pause time") has elapsed.

If the SOC of the battery is low enough, the deposited lithium can be dissolved by maintaining the charging-stopped state after the end of the permission period. Further, by stopping charging at the timing at which the permission period ends, dissolution of the deposited lithium is promoted in the pause period. Specifically, when the charging current that is large enough to permit occurrence of lithium deposition is applied, an overvoltage is being applied between the electrodes of the battery. When charging is stopped in this state, a residual voltage causes a very low discharging voltage to be applied between the electrodes. This makes the deposited lithium easily dissolved and absorbed into the anode. Using such a phenomenon, the deposited lithium generated in the permission period can be dissolved in the pause period.

The permission period may be a period from a timing (hereinafter referred to as a "permission starting point") at which the charging current becomes equal to the Li deposition limit value until a predetermined time (hereinafter referred to as "permission time") has elapsed.

If the charging current is too large relative to the Li deposition limit value, too much lithium deposition and lithium inactivation are caused. This prevents the deposited lithium from being dissolved after a stop of charging. Thus, in the permission period, the charging current is preferably maintained at around the Li deposition limit value. At the permission starting point, the charging current is equal to the Li deposition limit value. Starting the permission period at such timing makes it easier to maintain the charging current at around the Li deposition limit value at the beginning stage of the permission period.

If the above-described permission period is employed, in the permission period, the charging restriction value is preferably maintained at the Li deposition limit value at the permission starting point. Such a charging restriction value prevents a too large charging current, though permitting lithium deposition at the anode. Thus, the charging loss can be reduced while deterioration in battery performance due to lithium deposition is prevented.

The above-described permission time (a predetermined time which defines the length of the permission period) may be determined using at least one of the environmental temperature, the SOC, and the charging current of the lithium-ion secondary battery at the permission starting point.

Using these parameters makes it easier to set the permission time to an appropriate length.

A vehicle of the present disclosure includes a drive wheel; a motor generator mechanically connected to the drive wheel; a lithium-ion secondary battery configured to be charged with regenerative electric power generated by the motor generator; and a controller configured to control a charging current to the lithium-ion secondary battery. The controller includes: a control device configured to restrict the regenerative electric power so that the charging current does not exceed a charging restriction value; and a setting device configured to set the charging restriction value using a Li deposition limit value. The control device is configured to, if a predetermined permission condition is satisfied, permit lithium expected to dissolve after a stop of charging to deposit on the anode of the lithium-ion secondary battery by permitting the charging restriction value to become larger than the Li deposition limit value in a predetermined permission period.

Such a vehicle can restrict the charging current not to generate lithium deposition by controlling the setting device to set the charging restriction value to smaller than or equal to the Li deposition limit value. Further, by appropriately setting the permission condition and the permission period, the control device can appropriately relax the above-described restriction. Relaxing the restriction allows efficient charging by the regenerative electric power, thus enhancing the recovery rate of the regenerative electric power.

The above-described lithium-ion secondary battery is a secondary battery to be charged and discharged, with lithium serving as a charge carrier. The lithium-ion secondary battery includes not only a common lithium-ion secondary battery (electrolyte-solution lithium-ion secondary battery) that uses a liquid electrolyte (e.g. an organic solvent) but also a solid-state battery (solid-state lithium-ion secondary battery) that uses a solid electrolyte.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
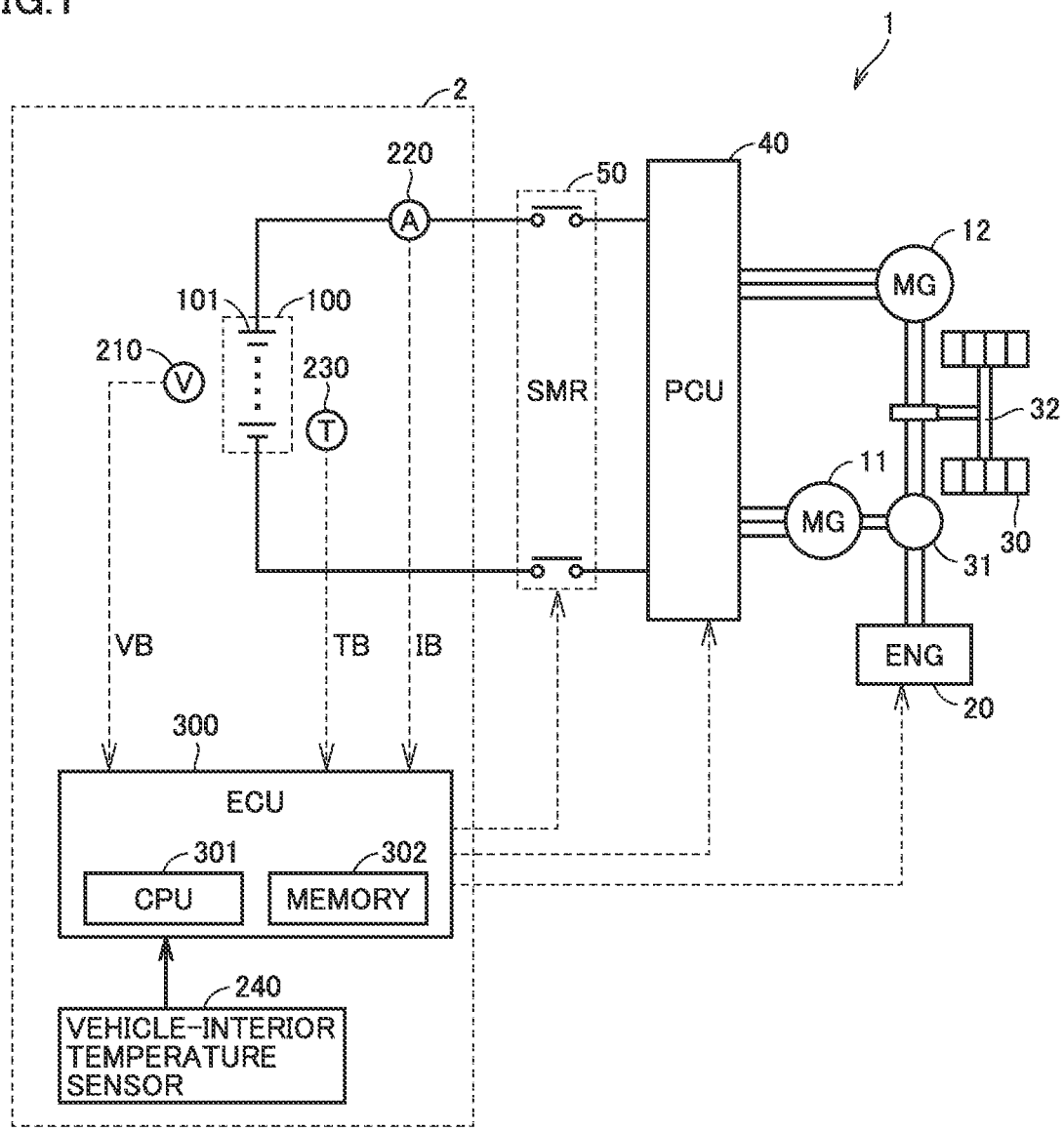
FIG. 1 is a block diagram schematically showing the general configuration of a vehicle mounted with a battery controller in an embodiment of the present disclosure.

An embodiment of the present disclosure is described in detail hereinafter with reference to the drawings. Identical or corresponding parts in the drawings are identically denoted, and the explanation thereof is not repeated.

The following describes a case in which a battery controller in the present embodiment is applied to a hybrid vehicle. The application of the battery controller, however, is not limited to a hybrid vehicle but may be an electric vehicle with no engine. The battery controller is not limited to an on-vehicle device but may be a stationary device. Further, the battery to be controlled is not limited to a battery pack which is hereinafter described, but may be a single battery.

FIG. 1 is a block diagram schematically showing the general configuration of a vehicle 1 mounted with a battery controller in the present embodiment.

With reference to FIG. 1, vehicle 1 includes motor generators (hereinafter referred to as "MGs") 11, 12, an engine 20, drive wheels 30, a motive power dividing device 31, a drive shaft 32, a power control unit (hereinafter referred to as a "PCU") 40, a system main relay (hereinafter referred to as an "SMR") 50, and a battery system 2.

Battery system 2 includes a battery 100, a voltage sensor 210, a current sensor 220, a temperature sensor 230, a vehicle-interior temperature sensor 240, and an electronic control unit (hereinafter referred to as an "ECU") 300. ECU 300 in the present embodiment is an example of a "controller for a lithium-ion secondary battery" in the present disclosure.

Battery 100 is mounted, for example, in the interior of vehicle 1. Battery 100 is a rechargeable DC power supply. Battery 100 includes a battery pack consisting of a plurality of secondary batteries connected in series. In the present embodiment, an electrolyte-solution lithium-ion secondary battery described hereinafter is employed as a secondary battery (hereinafter referred to as a "cell") 101 that constitutes the battery pack included in battery 100.

Cell 101 is formed by an electrode body contained in an angular-shaped battery case, for example. The electrode body is formed by winding a stack of a cathode and an anode, with a separator being interposed between the cathode and the anode. The electrolyte solution is held by the cathode, the anode, and the separator.

The cathode includes a cathode current collector (e.g. an aluminum foil) and a cathode active material layer. The cathode active material layer is formed on both sides of the cathode current collector by coating the surfaces of the cathode current collector with a cathode mixture that contains a cathode active material, a binder, and a conductive additive, for example. The anode includes an anode current collector (e.g. a copper foil) and an anode active material layer. The anode active material layer is formed on both sides of the anode current collector by coating the surfaces of the anode current collector with an anode mixture that contains an anode active material, a binder, and a conductive additive, for example.

The cathode, the anode, the separator, and the electrolyte solution may have any known composition and may be made of any known material as the cathode, the anode, the separator, and the electrolyte solution of a lithium-ion secondary battery. By way of example, the cathode active material may be nickel-cobalt-manganese composite oxide that contains lithium (a ternary material, that is, lithium cobalt oxide partially substituted by nickel and manganese). The anode active material may be a carbon material (e.g. graphite). The separator may be made of polyolefin (e.g. polyethylene or polypropylene). The electrolytic solution may be a solution that contains: an organic solvent (e.g. a mixture of dimethyl carbonate (DMC), ethyl methyl carbonate (EMC), and ethylene carbonate (EC)); a lithium salt (e.g. $LiPF_6$); and an additive (e.g. lithium bis (oxalate) borate (LiBOB) or $Li[PF_2(C_2O_4)_2]$).

The configuration of cell 101 (lithium-ion secondary battery) is not limited to the above but can be modified in accordance with, for example, the configuration and the use of the vehicle to which cell 101 is applied. For example, the electrode body may have a layered structure, instead of a wound structure. The battery case may have a cylindrical or laminated shape, instead of an angular shape. Instead of the electrolytic solution, a polymer electrolyte or an inorganic (e.g. oxide or sulfide) solid electrolyte may be used.

PCU 40 performs two-way power conversion between battery 100 and MGs 11, 12 in accordance with the control signal from ECU 300. PCU 40 is configured to control the states of MGs 11, 12 independently of each other. For example, PCU 40 controls MG 11 to be in a power generation state, while controlling MG 12 to be in a powering state. PCU 40 includes, for example, two inverters corresponding to MGs 11, 12; and a converter to raise the DC voltage supplied to each inverter to more than or equal to the output voltage of battery 100.

Each of MGs 11, 12 is an AC dynamo-electric machine, such as a three-phase AC synchronous motor having a rotor with embedded permanent magnets. MG 11 is used mainly as a power generator to be driven by engine 20 via motive power dividing device 31. Electric power generated by MG 11 is supplied to MG 12 or battery 100 through PCU 40.

MG 12 operates mainly as an electric motor for driving drive wheels 30. MG 12 is driven by receiving at least one of electric power from battery 100 and electric power generated by MG 11. The driving force from MG 12 is transmitted to drive shaft 32. At the time of a low acceleration during braking and traveling on a descending slope of vehicle 1, MG 12 operates as a power generator to perform regenerative power generation. The electric power generated by regenerative power generation by MG 12 is hereinafter referred to as "regenerative electric power". Electric power (e.g. regenerative electric power) generated by MG 12 is supplied to battery 100 through PCU 40.

Engine 20 is an internal combustion engine to output a motive power by converting combustion energy generated by combusting an air-fuel mixture into kinetic energy for movable parts, such as a piston or a rotor. Motive power dividing device 31 includes planetary gear mechanism having three rotating shafts of a sun gear, a carrier, and a ring gear, for example. Motive power dividing device 31 divides motive power outputted from engine 20 into motive power for driving MG 11 and motive power for driving drive wheels 30.

SMR 50 is electrically connected to the current path that connects battery 100 and PCU 40 to each other. When SMR 50 is closed in accordance with the control signal from ECU 300, battery 100 and PCU 40 can give and receive electric power to and from each other.

Voltage sensor 210 detects a voltage VB of each cell 101 of battery 100. Current sensor 220 detects a current IB (the charging side is defined as negative) inputted to and outputted from battery 100. Temperature sensor 230 detects a temperature TB of each cell 101 of battery 100. Each sensor outputs a detection result to ECU 300.

The current flowing through battery 100 is the same as the current flowing through each cell 101. That is, current IB is the same as the current flowing through each cell 101. Current IB during charging (negative number) corresponds to the charging current. One voltage sensor 210 and one temperature sensor 230 are provided for each cell 101, for example. However, this is not a limitation. One voltage sensor 210 and one temperature sensor 230 may be provided for each group of a plurality of cells 101, or may be provided for one battery pack.

Vehicle-interior temperature sensor 240 detects the temperature in the interior of vehicle 1 (the temperature of the air in the vehicle interior) and outputs the detection value to ECU 300. The temperature in the interior of vehicle 1 corresponds to the environmental temperature of battery 100 (and thus the lithium-ion secondary battery in battery 100). That is, in the present embodiment, the environmental temperature of the lithium-ion secondary battery is detected by vehicle-interior temperature sensor 240.

ECU 300 includes a central processing unit (CPU) 301, a memory 302, and an input-output buffer (not shown). Memory 302 includes a read only memory (ROM), a random access memory (RAM), and a rewritable nonvolatile memory. Various types of control are performed by CPU 301 executing a program stored in memory 302 (e.g. the ROM). ECU 300 controls each device based on, for example, the signal from each sensor and the program stored in memory 302, so that vehicle 1 and battery system 2 will be in a desired state. For example, by controlling engine 20 and PCU 40, ECU 300 executes the traveling control for vehicle 1 and the charging/discharging control for battery 100. The various types of control to be performed by ECU 300 may be implemented not only by software, but also by dedicated hardware (electric circuit).

ECU 300 in the present embodiment includes a "control device" and a "setting device" in the present disclosure. Specifically, the "control device" and the "setting device" are embodied in CPU 301 and the program in memory 302.

ECU 300 acquires a required current from the state of vehicle 1 (such as the vehicle speed, the engine rotational speed, and the quantity of accelerator operation) determined using the outputs from the sensors. Using the required current acquired, ECU 300 controls the current (the charging current and the discharging current) inputted to and outputted from battery 100 (and thus cell 101). The required current is a current inputted to and outputted from battery 100 when the current restriction is not performed. When the charging current is not restricted, the charging current supplied to battery 100 is equal to the required current.

By the way, when lithium (metallic lithium) is deposited on the anode of a lithium-ion secondary battery, the lithium remaining on the anode surface tends to cause deterioration in performance (e.g. battery capacity) of the lithium-ion secondary battery. The lithium deposition in the lithium-ion secondary battery is more likely to occur as the charging current to the battery is increased.

In order to prevent the lithium deposition on the anode of cell 101, ECU 300 calculates the Li deposition limit value representing the maximum value of the charging current that does not cause deposition of lithium on the anode of cell 101 in vehicle 1. ECU 300 uses this Li deposition limit value to control the charging current to cell 101. When the battery (each cell 101) is in a state that easily promotes lithium deposition, the Li deposition limit value is smaller. Examples of the state that easily promotes lithium deposition include: the battery is charged when it is already in a highly charged state (high SOC), the battery is continuously charged for a long time, and the battery is charged with its battery resistance being high (e.g. with the battery temperature being low).

ECU 300 restricts the charging current so that the charging current does not exceed the charging restriction value which is set by using the Li deposition limit value. ECU 300 can restrict the regenerative electric power (and thus the charging current) by controlling PCU 40 to restrict the regenerative power generation by MG 12.

By setting the above-described charging restriction value to smaller than or equal to the Li deposition limit value, the charging current can be restricted so that lithium deposition will not occur. The restriction of the charging current to the battery, however, leads to an increase in charging loss. When electric power (e.g. regenerative electric power) is available for supply to the battery, the restriction of the charging current to the battery would restrict charging of the battery, thus increasing the charging loss.

Figure 2:
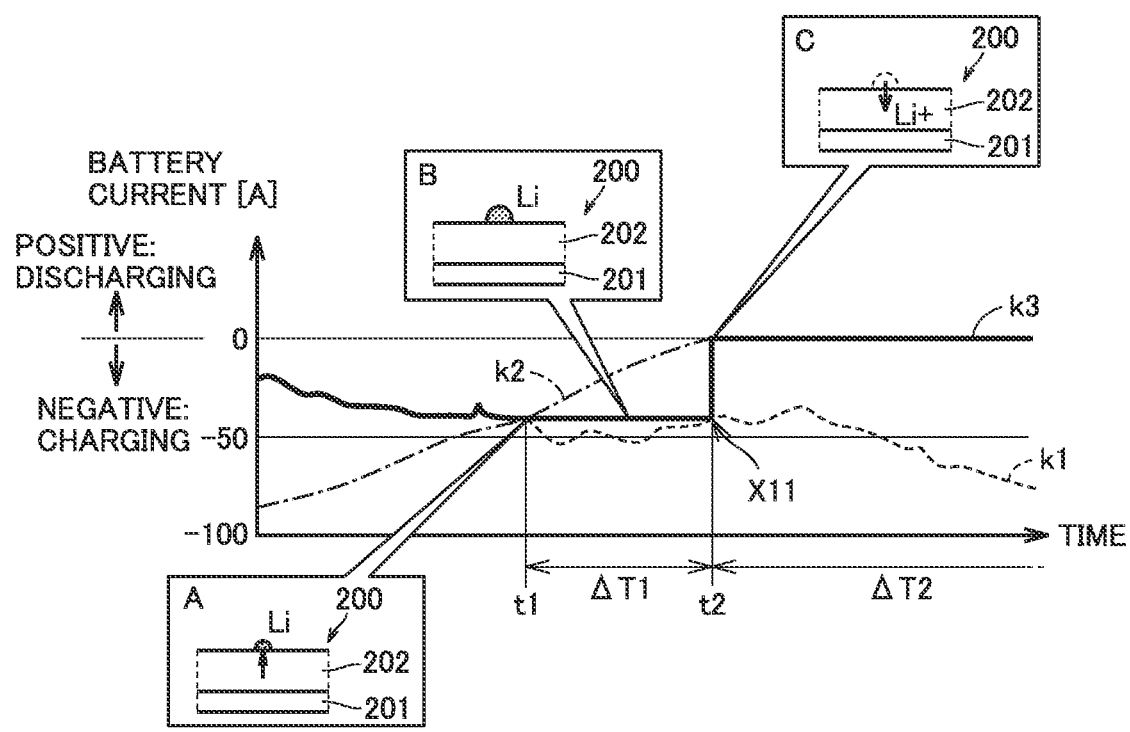
FIG. 2 shows an example of the charging current control to be performed by a battery controller in an embodiment of the present disclosure.

Accordingly, rather than setting the charging restriction value to smaller than or equal to the Li deposition limit value all the time, ECU 300 permits the charging restriction value to become larger than the Li deposition limit value in a predetermined permission period if a predetermined permission condition is satisfied. In the permission period, the restriction of the charging current is relaxed, and the lithium that is expected to dissolve after a stop of charging is permitted to deposit on the anode of cell 101. With reference to FIG. 2, the charging current control to be performed by ECU 300 is hereinafter described. Hereinafter, the current on the charging side is denoted by a negative number, and the current on the discharging side is denoted by a positive number. Note that the comparison between the magnitudes of current will be made by their absolute values, regardless of the plus/minus sign (+/−). That is, a current whose value is closer to 0 is smaller. When an upper limit value and a lower limit value are set on the charging current, the upper limit value is placed on the side where the absolute value of charging current is larger, and the lower limit value is placed on the side where the absolute value of charging current is smaller.

FIG. 2 shows an example of the charging current control to be performed by ECU 300. In FIG. 2, line k1 represents the required current, line k2 represents the Li deposition limit value, and line k3 represents the charging current. States A to C each represent the surface state of an anode 200 of cell 101. As shown in the drawing, anode 200 includes an anode current collector 201 and an anode active material layer 202.

With reference to FIG. 2, outside of the permission period (t1 to t2) which is described later, ECU 300 sets the Li deposition limit value as the charging restriction value to restrict the charging current so that the charging current does not exceed the Li deposition limit value.

In the period before timing t1 (up to t1), the required current (line k1) is smaller than the Li deposition limit value (line k2). The charging current (line k3), which is not restricted, is equal to the required current (line k1). In this period (up to t1), lithium deposition does not occur when a charging current equal to the required current is supplied to battery 100.

At timing t1, the required current (lines k1, k3) is equal to the Li deposition limit value (line k2). ECU 300 determines permission time ΔT1 based on the environmental temperature, the SOC, and the charging current at timing t1 of predetermined cell 101 (hereinafter referred to as a "target cell"), and sets the period from timing t1 until permission time ΔT1 has elapsed, as a permission period. Timing t1 corresponds to the permission starting point (the starting point of the permission period).

Permission time ΔT1 is determined by using, for example, information (hereinafter referred to as "ΔT1 determination information") representing the relation between the environmental temperature of the target cell at the permission starting point (hereinafter also referred to as "the environmental temperature at the start of permission"), the SOC of the target cell at the permission starting point (hereinafter also referred to as "the SOC at the start of permission"), the charging current of the target cell at the permission starting point (hereinafter also referred to as "the charging current at the start of permission"), and the permission time ΔT1. The ΔT1 determination information may be a map, a table, a numerical formula, or a model. A method of determining permission time ΔT1 is hereinafter described with reference to FIG. 3.

Figure 3:
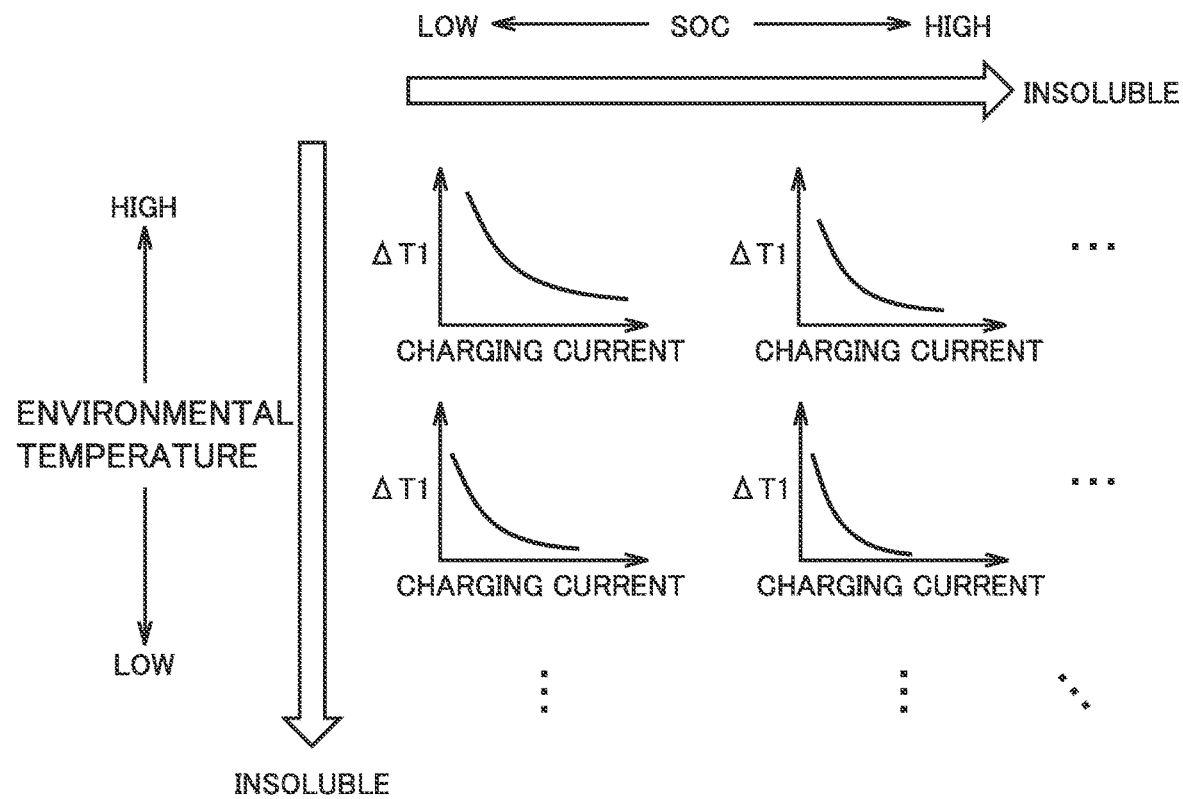
FIG. 3 shows an example of $\Delta T1$ determination information.

FIG. 3 shows an example of ΔT1 determination information (in particular, ΔT1 determination information comprising a combination of a plurality of maps). With reference to FIG. 3, ΔT1 determination information defines a relation in which permission time ΔT1 is shorter as the environmental temperature at the start of permission is lower, given a fixed SOC and a fixed charging current at the start of permission. The ΔT1 determination information also defines a relation in which permission time ΔT1 is shorter as the SOC at the start of permission is higher, given a fixed environmental temperature and a fixed charging current at the start of permission. The ΔT1 determination information also defines a relation in which permission time ΔT1 is shorter as the charging current at the start of permission is larger, given a fixed environmental temperature and a fixed SOC at the start of permission.

By referring to the above-described ΔT1 determination information, ECU 300 can set the permission time to an appropriate length based on the dissolvability of the deposited lithium of after a stop of charging. Specifically, if the deposited lithium is more difficult to dissolve after a stop of charging (the environmental temperature: low, the SOC: high, the charging current: large), then ECU 300 sets permission time ΔT1 to shorter so as to prevent an increase in lithium deposition quantity and prevent inactivation of the deposited lithium in the permission period.

The above-described ΔT1 determination information may be produced in advance by, for example, experiment and stored in memory 302. An example method of acquiring the data for producing ΔT1 determination information is hereinafter described with reference to FIG. 4 to FIG. 8.

For example, a small-sized visualized battery (in particular, a lithium-ion secondary battery) in which the anode surface can be observed is connected to charging equipment for experiment, and a charging test for the visualized battery is conducted. In this charging test, charging is executed and stopped under a predetermined condition and then the charging stopping state is maintained during pause time ΔT2, while the state of the anode surface (in particular, the presence or absence of deposited lithium) of the visualized battery is checked. The charging test is conducted by varying the charging condition (the charging current and the charging time), while the environmental temperature and the SOC at the start of charging, and pause time ΔT2 after a stop of charging are fixed. Whether or not lithium deposition occurs during execution of charging is checked for each charging condition. If lithium deposition occurs during execution of charging, it is checked whether or not the deposited lithium is dissolved in the pause period (the period from the timing of a stop of charging until pause time ΔT2 has elapsed). In the present embodiment, pause time ΔT2 is 10 minutes.

Figure 4:
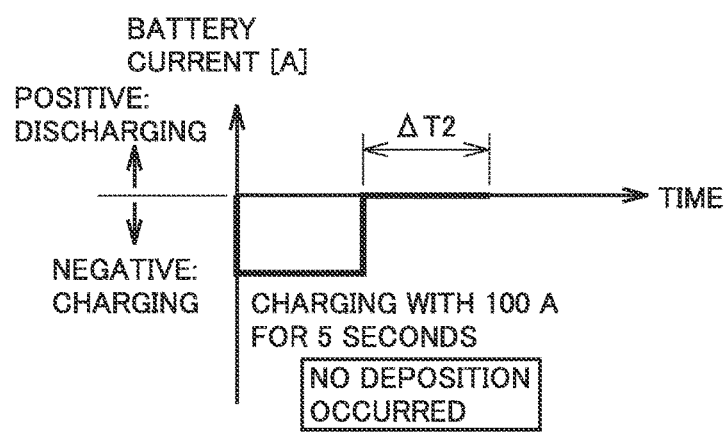
FIG. 4 shows an example of the charging condition under which lithium deposition did not occur during execution of charging in a charging test.

FIG. 4 shows an example of the charging condition under which lithium deposition did not occur during execution of charging in a charging test. With reference to FIG. 4, in this example, lithium deposition did not occur when charging was performed under a charging current of −100 A for 5 consecutive seconds.

Figure 5:
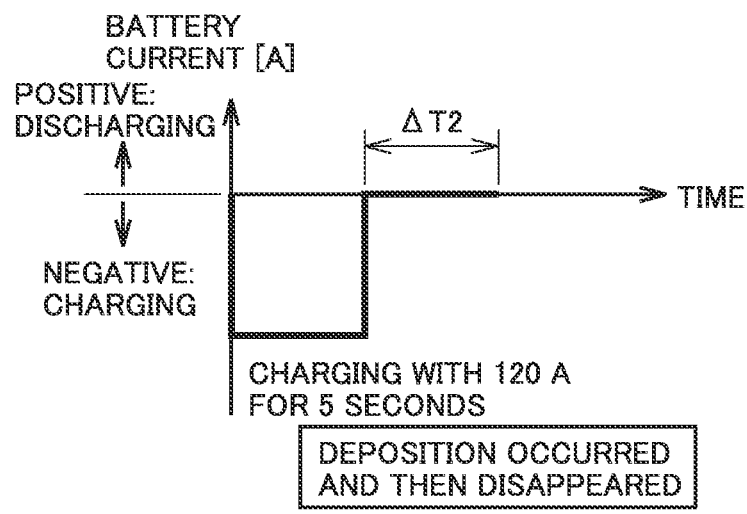
FIG. 5 shows a first example of the charging condition under which lithium deposition occurred during execution of charging but the deposited lithium was dissolved in the pause period after a stop of charging in a charging test.

FIG. 5 shows a first example of the charging condition under which lithium deposition occurred during execution of charging but the deposited lithium was dissolved in the pause period after a stop of charging in a charging test. With reference to FIG. 5, in this example, charging was performed under a charging current of −120 A for a charging time of 5 seconds. Although lithium deposition occurred during execution of charging, the deposited lithium was dissolved and disappeared in the pause period after a stop of charging.

Figure 6:
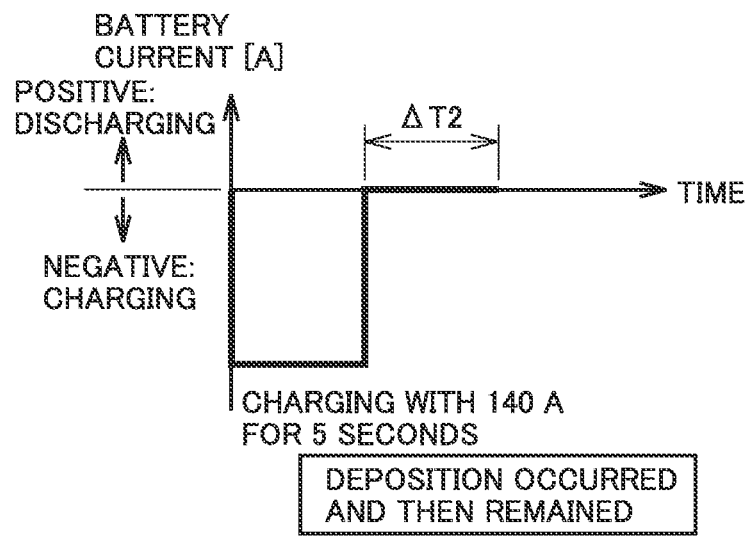
FIG. 6 shows a first example of the charging condition under which lithium deposition occurred during execution of charging and the deposited lithium remained undissolved in the pause period after a stop of charging in a charging test.

FIG. 6 shows a first example of the charging condition under which lithium deposition occurred during execution of charging and the deposited lithium remained undissolved in the pause period after a stop of charging in a charging test. With reference to FIG. 6, in this example, charging was performed under a charging current of −140 A for a charging time of 5 seconds. Lithium deposition occurred during execution of charging, and the deposited lithium remained undissolved in the pause period after a stop of charging. At the end of the pause period (i.e., the timing when pause time ΔT2 elapsed from the timing of a stop of charging), a residue of metallic lithium was observed on the anode surface. A conceivable reason is that the large charging current caused the deposited lithium to be inactivated (insolubilized) during execution of charging.

Figure 7:
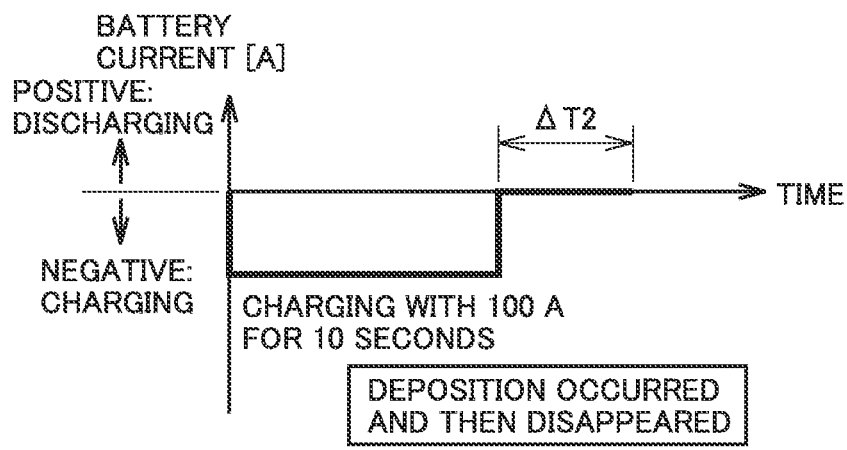
FIG. 7 shows a second example of the charging condition under which lithium deposition occurred during execution of charging but the deposited lithium was dissolved in the pause period after a stop of charging in a charging test.

FIG. 7 shows a second example of the charging condition under which lithium deposition occurred during execution of charging but the deposited lithium was dissolved in the pause period after a stop of charging in a charging test. With reference to FIG. 7, in this example, charging was performed under a charging current of −100 A for a charging time of 10 seconds. Although lithium deposition occurred during execution of charging, the deposited lithium was dissolved and disappeared in the pause period after a stop of charging.

Figure 8:
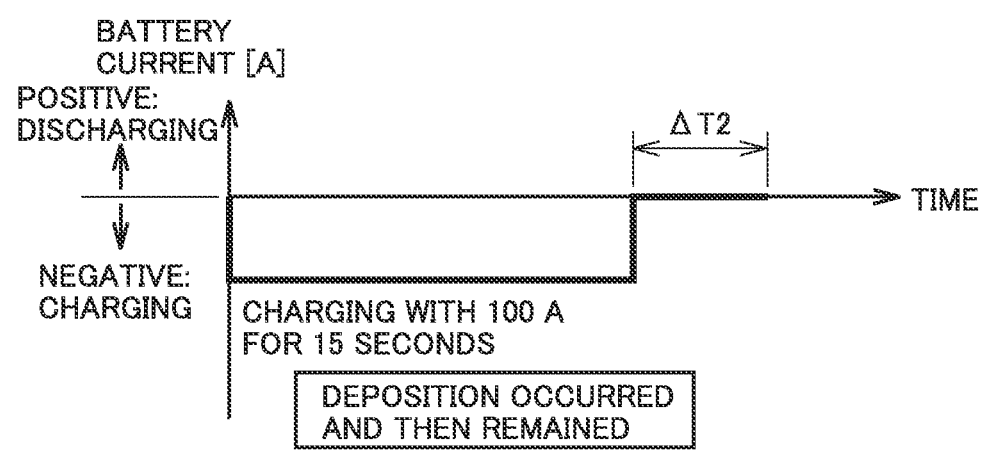
FIG. 8 shows a second example of the charging condition under which lithium deposition occurred during execution of charging and the deposited lithium remained undissolved in the pause period after a stop of charging in a charging test.

FIG. 8 shows a second example of the charging condition under which lithium deposition occurred during execution of charging and the deposited lithium remained undissolved in the pause period after a stop of charging in a charging test. With reference to FIG. 8, in this example, charging was performed under a charging current of −100 A for a charging time of 15 seconds. Lithium deposition occurred during execution of charging, and the deposited lithium remained undissolved in the pause period after a stop of charging. At the end of the pause period, a residue of metallic lithium was observed on the anode surface. A conceivable reason is that the long charging time caused the deposited lithium to be inactivated (insolubilized) during execution of charging.

The charging tests as described above can provide the charging condition (e.g. the charging current and the charging time shown in FIG. 5 and FIG. 7) under which the lithium expected to dissolve in the pause period after a stop of charging is deposited. Using the charging condition, ΔT1 determination information can be produced. Based on the results of the charging tests shown in FIG. 4 to FIG. 6, in ΔT1 determination information, permission time ΔT1 for when the charging current at the start of permission is −120 A can be 5 seconds (see FIG. 5), for example. Based on the results of the charging tests shown in FIG. 4, FIG. 7, and FIG. 8, in ΔT1 determination information, permission time ΔT1 for when the charging current at the start of permission is −100 A can be 10 seconds (see FIG. 7). The environmental temperature and the SOC at the start of permission in ΔT1 determination information can be the environmental temperature and the SOC at the start of charging in the charging test.

In the above-described case, the charging current or the charging time was selected as a target parameter, and the charging test was conducted by varying the target parameter, with the other parameters (e.g. the environmental temperature and the SOC at the start of charging) being fixed. However, the target parameter can be selected arbitrarily. If other parameters (e.g. the environmental temperature and the SOC at the start of charging) are used as target parameters, all the data required to produce ΔT1 determination information can be acquired as well by conducting similar charging tests.

In a preferable example, permission time ΔT1 is set to not less than 1 second and not more than 50 seconds, and pause time ΔT2 is set to not less than 1 minute and not more than 10 minutes. Permission time ΔT1 and pause time ΔT2, however, are not limited to the above ranges but may be set to appropriate values in accordance with the characteristics of the battery.

Lithium deposition does not easily occur at the beginning stage of use (the stage soon after the start of use) of a battery, and lithium deposition becomes a problem mainly at the end stage of life of the battery. Accordingly, it is preferable that the above-described visualized battery be brought into the state of the end stage of life (e.g. the state of 10 years old), so that the data tailored to the battery in its end stage of life can be acquired and thus ΔT1 determination information tailored to the battery in its end stage of life can be produced. Using such ΔT1 determination information from the beginning stage of use of the battery eliminates the need to correct ΔT1 determination information with the lapse of time. If ΔT1 determination information tailored to the battery at its beginning stage of use is produced and is then corrected while being used, a change in electricity efficiency (power consumption rate) (in particular, deterioration in electricity efficiency) with the lapse of time will easily occur.

Referring back to FIG. 2, in the permission period set as described above, the charging restriction value is permitted to become larger than the Li deposition limit value. Specifically, in the permission period, charging restriction value X11 is maintained at the Li deposition limit value at the permission starting point (timing t1) (hereinafter also referred to as a "permission starting value"). The permission starting point is the timing at which the required current (and thus the charging current) becomes equal to the Li deposition limit value. In the period before the permission starting point (up to t1), the charging current is restricted so that the charging current does not exceed the Li deposition limit value (line k2) (i.e., "[charging current]<[Li deposition limit value]"). An increase in charging current and/or a decrease in Li deposition limit value makes the charging current equal to the Li deposition limit value at timing t1. Immediately after timing t1, the permission starting value is larger than the Li deposition limit value. Thus, immediately after timing t1, charging restriction value X11 (=permission starting value) becomes larger than the Li deposition limit value, and the charging current is permitted to become larger than the Li deposition limit value. Thus, lithium (Li) is deposited on the surface of anode 200 as shown by state A in FIG. 2.

In the example shown in FIG. 2, in the permission period (t1 to t2), the required current (line k1) is larger than charging restriction value X11 (=permission starting value). The charging current (line k3) is controlled to be equal to charging restriction value X11, thus being maintained at a value larger than the Li deposition limit value (line k2). This makes lithium deposition on the anode surface of the battery easier, and therefore, the Li deposition limit value is decreased. Due to such a change in Li deposition limit value, charging restriction value X11 (and thus the charging current) is larger than the Li deposition limit value (line k2) not only immediately after timing t1 but also over the entire permission period (t1 to t2). In the permission period in which the charging current is restricted by charging restriction value X11, the restriction of the charging current is relaxed compared to when the charging current is restricted by the Li deposition limit value. Thus, in the permission period, lithium (Li) continues to deposit on the surface of anode 200, and the lithium deposition quantity increases with the lapse of time from the permission starting point (timing t1), as shown by state B in FIG. 2.

The permission period ends at timing t2 after a lapse of permission time ΔT1 from the permission starting point (timing t1). When the permission period ends, ECU 300 stops charging at timing t2 at which the permission period has ended. In the pause period from timing t2 of a stop of charging until predetermined pause time ΔT2 has elapsed, ECU 300 does not perform charging. Pause time ΔT2 is the same as pause time ΔT2 that is used in the method of producing ΔT1 determination information described above (see FIG. 4 to FIG. 8). Since permission time ΔT1 is set using ΔT1 determination information, the deposited lithium generated in the permission period (t1 to t2) is dissolved in the pause period (the period from timing t2 until pause time ΔT2 has elapsed). At timing t2, charging is stopped while an overvoltage is applied between the electrodes of the battery (each cell 101), so as to apply a charging current larger than the Li deposition limit value. A residual voltage after the stop of charging causes a very low discharging voltage to be applied between the electrodes, thus promoting dissolution of the deposited lithium in pause time ΔT2. Timing t2 corresponds to the pause starting point.

The deposited lithium, when dissolved, becomes lithium ion (Li$^+$) and returns into anode 200, as shown by state C in FIG. 2. However, when the SOC of the target cell is too high (when the battery is nearly fully charged), the anode of the target cell does not have capacity enough to receive the lithium ion, and the deposited lithium stops dissolving. Accordingly, in the present embodiment, a permission condition is satisfied if the SOC of the target cell is lower than a permitted SOC (hereinafter referred to as "$S_A$"). Only when the permission condition is satisfied, the permission period is set during which the current restriction is relaxed. $S_A$ is an SOC selected from the range of not less than 90% and not more than 100% and can be set by, for example, experiment in advance. The SOC range defined by ΔT1 determination information described above is lower than $S_A$.

As described above, if the predetermined permission condition is satisfied (e.g. if the SOC of the target cell is lower than $S_A$), ECU 300 in the present embodiment permits lithium, which is expected to dissolve after a stop of charging, to deposit on the anode of the target cell (lithium-ion secondary battery) by permitting the charging restriction value to become larger than the Li deposition limit value in the permission period (t1 to t2). The target cell may be a single cell, or may be a plurality of cells (a plurality of cells constituting a part of or the whole of the battery pack in battery 100).

According to the above-described control, lithium deposition is permitted in the permission period, and thus the restriction of the charging current is relaxed compared to when the charging current is restricted not to permit any lithium deposition. Specifically, in the permission period, the charging current is permitted to become larger than the Li deposition limit value. Such relaxation of the restriction of the charging current can increase the chance of charging and prolong the charging time, thus reducing the charging loss.

The lithium which is deposited in the above-described permission period is the lithium expected to dissolve after a stop of charging. For example, by determining permission time ΔT1 (and thus the permission period) using ΔT1 determination information produced by the above-described method, the lithium expected to dissolve after a stop of charging is deposited in the permission period. Since such lithium is dissolved in the pause period after a stop of charging, lithium (metallic lithium) does not remain on the anode surface of the target cell at the start of the next charging. Therefore, the above-described control can prevent deterioration in battery performance due to lithium deposition.

The charging control to be performed by ECU 300 is hereinafter described in detail with reference to FIG. 9 and FIG. 10.

Figure 9:
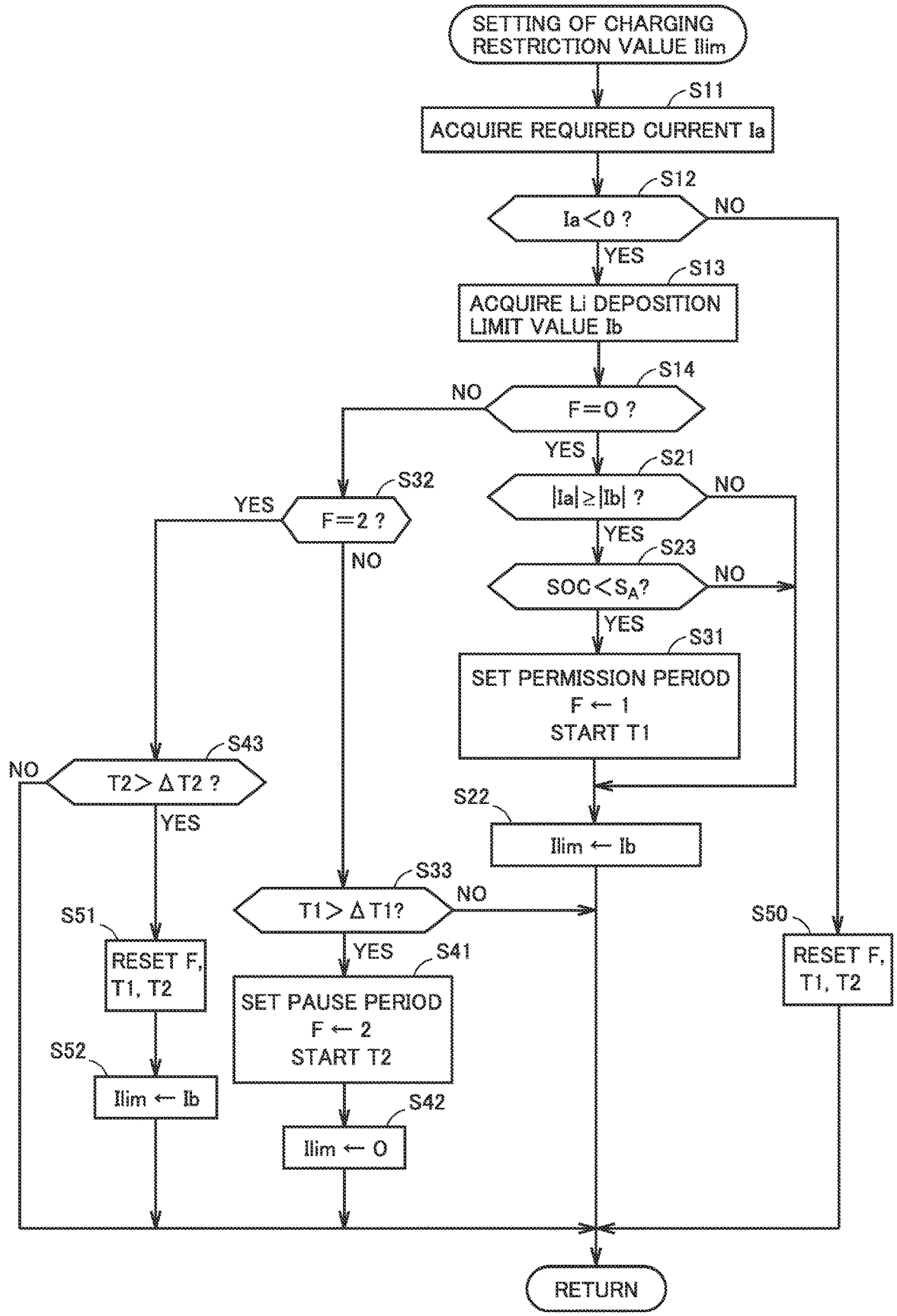
FIG. 9 is a flowchart showing the procedure of the charging restriction value setting process to be executed by a battery controller in an embodiment of the present disclosure.

FIG. 9 is a flowchart showing the procedure of the charging restriction value setting process to be executed by ECU 300. The process shown in this flowchart is called from the main routine each time a predetermined time has elapsed or when a predetermined condition is satisfied, and is repeatedly executed.

Memory 302 stores a flag F which represents the status: "in the permission period", "in the pause period", or "in neither of these periods". As the value of flag F, any one of 2, 1, and 0 is set, and its initial value is 0. Flag F having a value of 1 represents "in the permission period", flag F having a value of 2 represents "in the pause period", and flag F having a value of 0 represents "in neither of these periods".

Memory 302 also stores a timer T1 that indicates the elapsed time from the permission starting point, and a timer T2 that indicates the elapsed time from the pause starting point.

With reference to FIG. 9, ECU 300 acquires a required current Ia (hereinafter also simply referred to as "Ia") based on the state of vehicle 1 (such as the vehicle speed, the engine rotational speed, and the quantity of accelerator operation) (step S11). ECU 300 then saves the acquired Ia in memory 302.

For example, when the quantity of accelerator operation is 0 (i.e., no operation), an increase in vehicle speed causes an increase in regenerative electric power supplied from MG 12 to battery 100, and causes an increase in absolute value of required current Ia on the charging side (negative number). When the rotational speed of engine 20 is 0 (i.e., when engine 20 is stopped), an increase in quantity of accelerator operation causes an increase in electric power required to drive the drive wheels 30 (and thus to drive MG 12), and causes an increase in absolute value of required current Ia on the discharging side (positive number).

The rotational speed of engine 20 can be detected using the output from a not-shown engine rotation sensor (e.g. a crank angle sensor). An example of the quantity of accelerator operation is the depressing quantity of an accelerator pedal (not shown) of vehicle 1. The depressing quantity of the accelerator pedal can be detected using, for example, the output from an accelerator position sensor. The quantity of accelerator operation of 0 means no depressing of the accelerator pedal, for example.

Then, ECU 300 determines whether or not required current Ia acquired at step S11 is smaller than 0 (i.e., whether or not it is a charging current) (step S12). If it is determined that required current Ia is not smaller than 0 (i.e., it is not a charging current) (NO at step S12), flag F and timers T1, T2 are reset (i.e., set to the initial value of 0) at step S50, and then the process is returned to the main routine.

On the other hand, if it is determined that required current Ia is smaller than 0 (i.e., it is a charging current) (YES at step S12), ECU 300 acquires a Li deposition limit value Ib (hereinafter also simply referred to as "Ib") at step S13. ECU 300 then saves the acquired Ib in memory 302.

Li deposition limit value Ib is calculated from, for example, the SOC of the target cell, the temperature of the target cell, and the charging history of the target cell (e.g. the current integrated value of continuous charging). For example, Li deposition limit value Ib is made smaller as the SOC of the target cell is higher, as the temperature of the target cell is lower, and as the current integrated value of continuous charging is larger. The current of the target cell can be detected using the output (current IB) from current sensor 220. The temperature of the target cell can be detected using the output (temperature TB) from temperature sensor 230. The SOC of the target cell may be calculated by any method. For example, a method by current value integration (coulomb counting) or a method by estimation of the open circuit voltage (OCV) may be employed.

Then, ECU 300 determines whether or not flag F is 0 (step S14). If it is determined that flag F is 0 (YES at step S14), ECU 300 determines whether or not |Ia| (the absolute value of Ia) is larger than or equal to |Ib| (the absolute value of Ib) at step S21. If it is determined that is smaller than |Ib| (i.e., the required current is smaller than the Li deposition limit value) (NO at step S21), ECU 300 sets Li deposition limit value Ib (Ib acquired at step S13) as charging restriction value Ilim (hereinafter also simply referred to as "Ilim") at step S22. After that, the process is returned to the main routine. Charging restriction value Ilim is stored in memory 302, for example.

For example, in the example of FIG. 2, the required current (lines k1, k3) is smaller than the Li deposition limit value (line k2) in the period before timing t1 (up to t1). Thus, after Li deposition limit value Ib is acquired at step S13, step S21 is determined to be NO, and Li deposition limit value Ib is set as charging restriction value Ilim at step S22. If the required current (lines k1, k3) becomes equal to the Li deposition limit value (line k2) at timing t1, it is determined that is larger than or equal to |Ib| at step S21 (YES at step S21).

If step S21 is determined to be YES, ECU 300 acquires the SOC of the target cell, and determines whether or not the SOC of the target cell is lower than $S_A$ (permitted SOC) (step S23). The determination at step S23 corresponds to the determination of whether or not the permission condition is satisfied. $S_A$ is stored in memory 302, for example. $S_A$ is an SOC selected from the range of not less than 90% and not more than 100% (i.e., a quantity of charge close to the full charge) and can be set by, for example, experiment in advance. $S_A$ may be a fixed value or may be variable depending on the state of the target cell (e.g. the battery temperature).

If it is determined that the SOC of the target cell is not lower than $S_A$ (NO at step S23), then it is determined that the permission condition is not satisfied, and Ib is set as Ilim by the above-described process of step S22.

On the other hand, if it is determined that the SOC of the target cell is lower than $S_A$ (YES at step S23), then it is determined that the permission condition is satisfied, and the process goes on to step S31.

At step S31, ECU 300 sets the permission period, sets flag F to 1, and starts timer T1. The timing at which timer T1 is started corresponds to the permission starting point. The process of step S31 brings the status into "in the permission period". Then, at step S22, Li deposition limit value Ib (permission starting value) at the permission starting point is set as charging restriction value Ilim.

In the present embodiment, at step S31, ECU 300 determines permission time ΔT1 using the above-described ΔT1 determination information (FIG. 3), and sets the period from the permission starting point until permission time ΔT1 has elapsed, as the above-described permission period. Permission time ΔT1 is set based on the environmental temperature, the SOC, and the charging current at the start of permission. The relation between them is defined by ΔT1 determination information (FIG. 3). The environmental temperature of the target cell can be detected using the output from vehicle-interior temperature sensor 240, for example. Since the computing speed of ECU 300 is high enough, the timing at which required current Ia becomes equal to Li deposition limit value Ib (i.e., the timing at which step S21 is determined to be YES) can be regarded as the same as the processing timing of step S31.

Flag F being set to 1 at step S31 results in step S14 being determined to be NO (flag F is not 0), and ECU 300 determines whether or not flag F is 2 at step S32. During the permission period, flag F is 1 and thus step S32 is determined to be NO (flag F is not 2), and the process goes on to step S33.

At step S33, whether or not the permission period has ended is determined. Specifically, ECU 300 determines whether or not timer T1 exceeds permission time ΔT1 (i.e., whether or not permission time ΔT1 has elapsed from the permission starting point).

While it is determined that charging is going on (YES at step S12) and that timer T1 does not exceed permission time ΔT1 (NO at step S33), charging restriction value Ilim is not updated. Therefore, charging restriction value Ilim in the permission period is maintained at Li deposition limit value Ib (permission starting value) at the permission starting point. In the example of FIG. 2, charging restriction value X11 in the permission period (t1 to t2) is maintained at the Li deposition limit value at timing t1 (permission starting point).

When the permission period ends by timer T1 (the elapsed time from the permission starting point) exceeding permission time ΔT1, step S33 is determined to be YES. Then, at step S41, ECU 300 sets the pause period, sets flag F to 2, and starts timer T2. The timing at which timer T2 is started corresponds to the pause starting point. The process of step S41 brings the status into "in the pause period". Then, at step S42, charging restriction value Ilim is set to 0.

Flag F being set to 2 at step S41 results in step S32 being determined to be YES (flag F is 2), and whether or not the pause period has ended is determined at step S43. Specifically, ECU 300 determines whether or not timer T2 has exceeded pause time ΔT2 (i.e., whether or not pause time ΔT2 has elapsed from the pause starting point).

While it is determined that charging is going on (YES at step S12) and that timer T2 does not exceed pause time ΔT2 (NO at step S43), charging restriction value Ilim is not updated. Therefore, charging restriction value Ilim in the pause period is maintained at 0. When charging restriction value Ilim is 0, the current of battery 100 is controlled to be 0 by the process of FIG. 10 described later. In the pause period during which charging restriction value Ilim is maintained at 0, charging of battery 100 (and thus charging of the target cell) is not performed. In the example of FIG. 2, charging is stopped at timing t2 at which the permission period ends, and charging is not performed in the following pause period.

When the pause period ends by timer T2 (the elapsed time from the pause starting point) exceeding pause time ΔT2, step S43 is determined to be YES. Then, at step S51, ECU 300 resets flag F and timers T1, T2 (i.e., sets them to the initial value of 0), and then sets Li deposition limit value Ib as charging restriction value Ilim at step S52.

In the present embodiment, if the target cell is discharged in the pause period, then step S12 is determined to be NO and flag F and timers T1, T2 are reset at step S50, thus ending the pause period. If the target cell is discharged in the permission period, the permission period will end in the same manner.

Figure 10:
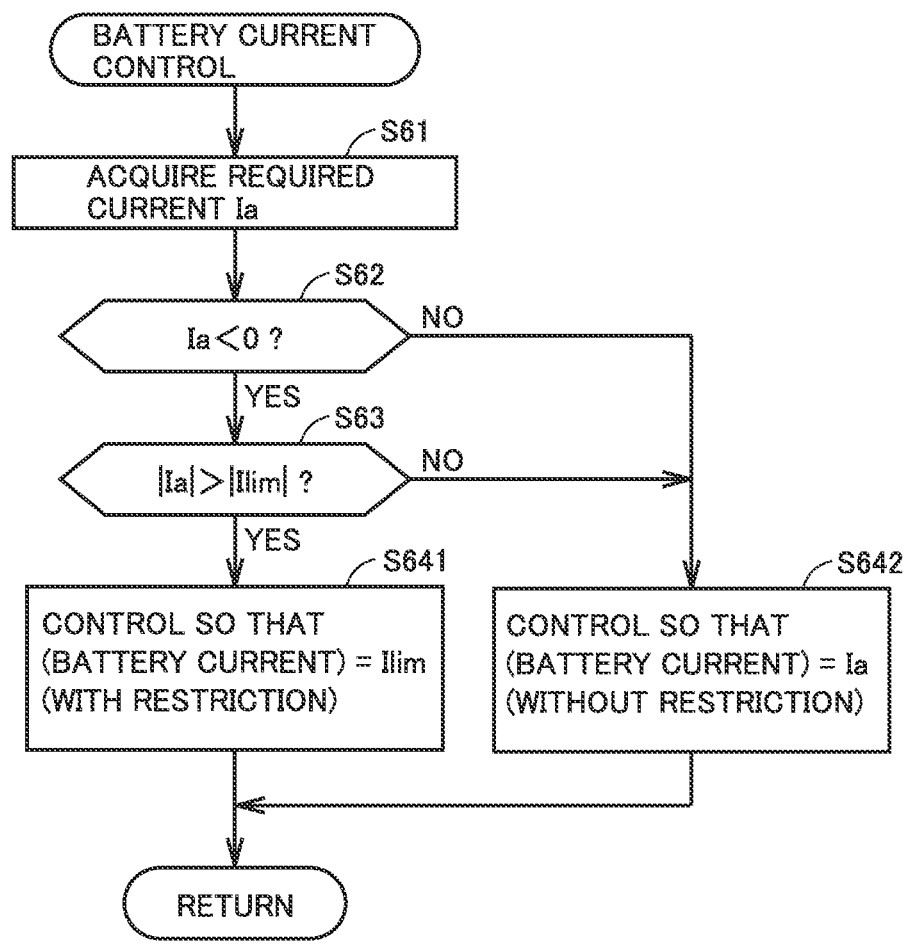
FIG. 10 is a flowchart showing the procedure of the battery current control to be executed by a battery controller in an embodiment of the present disclosure.

FIG. 10 is a flowchart showing the procedure of the battery current control to be executed by ECU 300. This battery current control is performed using charging restriction value Ilim set by the process of FIG. 9. The process shown in the flowchart of FIG. 10 is called from the main routine each time a predetermined time has elapsed or when a predetermined condition is satisfied, and is repeatedly executed.

With reference to FIG. 10, ECU 300 executes steps S61 and S62 similar to steps S11 and S12 in FIG. 9.

If it is determined that required current Ia is not smaller than 0 (i.e., it is not a charging current) at step S62 (NO at step S62), the charging current to battery 100 is controlled to be equal to required current Ia at step S642. Specifically, ECU 300 controls a current adjusting circuit, such as PCU 40, so that the current of battery 100 is equal to required current Ia. That is, the current restriction is not performed.

On the other hand, if it is determined that required current Ia is smaller than 0 at step S62 (YES at step S62), ECU 300 determines whether or not (the absolute value of Ia) is larger than |Ilim| (the absolute value of Ilim) (step S63). If it is determined that |Ia| is not larger than |Ilim| (i.e., the required current is not larger than the charging restriction value) (NO at step S63), the process of step S642 described above is executed. That is, the current restriction is not performed.

If it is determined that |Ia| is larger than |Ilim| (i.e., the required current is larger than the charging restriction value) at step S63 (YES at step S63), the charging current to battery 100 is controlled to be equal to charging restriction value Ilim at step S641. That is, the current restriction is performed. For example, ECU 300 restricts the regenerative electric power to be generated by MG 12. ECU 300 can restrict the generation of the regenerative electric power (and thus the charging current) by controlling a current adjusting circuit, such as PCU 40, to restrict the regenerative power generation from MG 12. If the charging restriction value Ilim is 0, no charging of battery 100 is performed, according to step S641.

Figure 11:
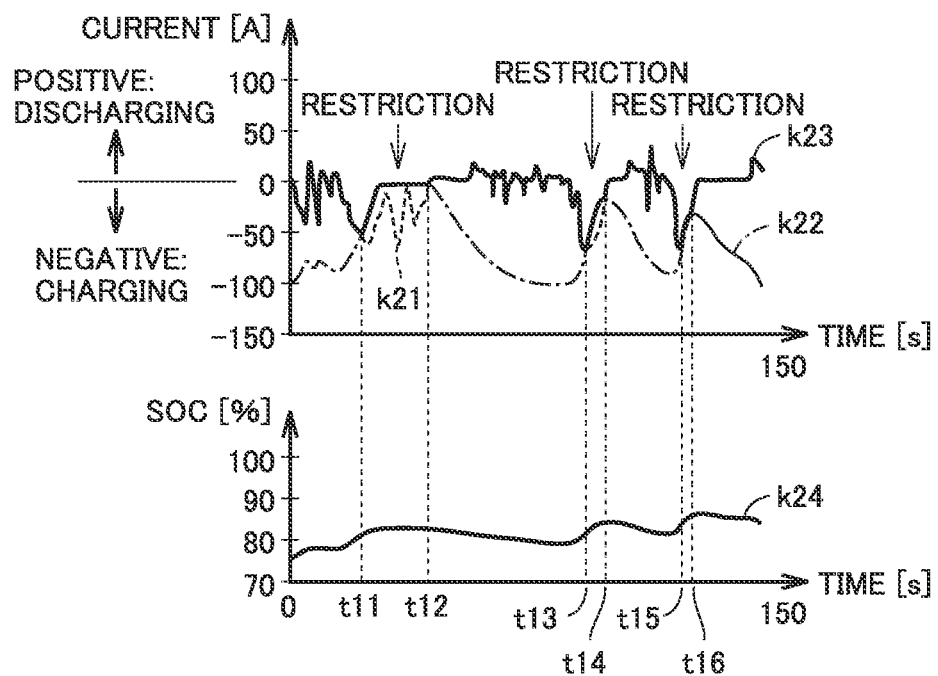
FIG. 11 shows the operation of a battery controller in a comparative example.
Figure 12:
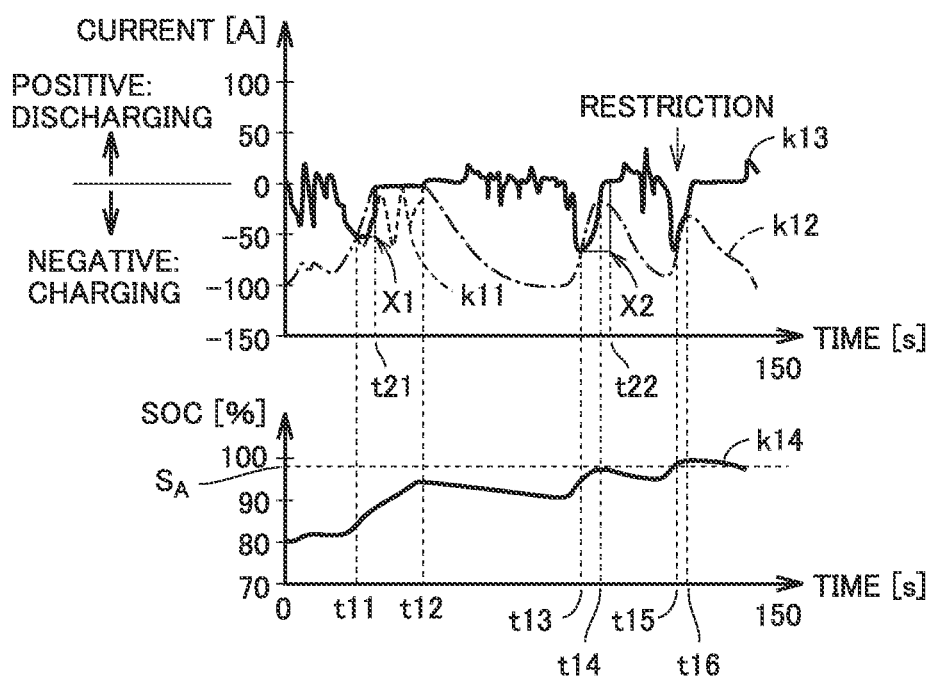
FIG. 12 shows the operation of a battery controller in the present example.

With reference to FIG. 11 and FIG. 12, the operation of the battery controller in the present example is described by comparison with the operation of a battery system in a comparative example.

FIG. 11 shows the operation of a battery controller in a comparative example. In the battery controller in the comparative example, the Li deposition limit value is always set as the charging restriction value. In FIG. 11, line k21 represents the required current, line k22 represents the Li deposition limit value, line k23 represents current IB (the current value detected by current sensor 220), and line k24 represents the SOC of the target cell. The SOC of the target cell increases in response to charging, and decreases in response to discharging.

With reference to FIG. 11, in the battery controller in the comparative example, in the period in which the required current (line k21) is smaller than or equal to the Li deposition limit value (line k22) (before timing t11, timing t12 to timing t13, timing t14 to timing t15, and after timing t16), the charging current is not restricted and thus the charging current (line k23) is equal to the required current (line k21).

In the period in which the required current (line k21) is larger than the Li deposition limit value (line k22) (timing t11 to timing t12, timing t13 to timing t14, and timing t15 to timing t16), the charging current (line k23) is controlled (restricted) to be equal to the Li deposition limit value (line k22).

FIG. 12 shows the operation of the battery controller in the present example. The battery controller in the present example performs the processes of FIG. 9 and FIG. 10 described above. Thus, if the predetermined permission condition is satisfied (e.g. if the SOC of the target cell is lower than $S_A$), the charging restriction value is permitted to become larger than the Li deposition limit value in the permission period. Accordingly, the lithium expected to dissolve after a stop of charging is permitted to deposit on the anode of the target cell (lithium-ion secondary battery).

In FIG. 12, line k11 represents the required current, line k12 represents the Li deposition limit value, line k13 represents current IB (the current value detected by current sensor 220), and line k14 represents the SOC of the target cell. $S_A$ in FIG. 12 is the same as $S_A$ used in the process of step S23 in FIG. 9. In the example of FIG. 12, $S_A$ is set to 98%. For easy comparison, line k11 and line k12 in FIG. 12 are respectively the same as line k21 and line k22 in FIG. 11. Also, timing t11 to timing t16 in FIG. 12 are respectively the same as timing t11 to timing t16 in FIG. 11.

With reference to FIG. 12 along with FIG. 9 and FIG. 10, at timing t11, the required current (lines k11, k13) becomes equal to the Li deposition limit value (line k12). Accordingly, step S21 in FIG. 9 is determined to be YES. Since the SOC (line k14) at timing t11 is lower than $S_A$, it is determined that the permission condition is satisfied (YES at step S23 in FIG. 9) and thus the permission period is set at step S31 in FIG. 9. The permission period is set based on the environmental temperature, the SOC and the charging current at the start of permission. Timing t11 to timing t21 corresponds to the permission period.

Charging restriction value X1 in the permission period is maintained at the Li deposition limit value at the permission starting point (timing t11). Accordingly, charging restriction value X1 in the permission period is larger than the Li deposition limit value (line k12). That is, the restriction of the charging current is relaxed in the permission period.

In the permission period (t11 to t21), the charging current (line k13) is controlled based on charging restriction value X1. By the process of FIG. 10, if the required current (line k11) is larger than charging restriction value X1 (YES at step S63), then the charging current (line k23) is restricted so that the charging current does not exceed charging restriction value X1 (step S641); and if the required current (line k11) is not larger than charging restriction value X1 (NO at step S63), then the charging current is not restricted and thus the charging current (line k13) is equal to the required current (line k11) (step S642).

When the permission period ends at timing t21 (YES at step S33 in FIG. 9), then the charging restriction value is set to 0 (step S42 in FIG. 9), and charging is stopped by the process of FIG. 10 (step S641). In the pause period after the stop of charging, the charging restriction value is maintained at 0. Thus, in the pause period, charging to battery 100 (and thus charging to the target cell) is not performed (step S641 in FIG. 10). When the pause period ends, the Li deposition limit value is set as the charging restriction value again by the process of FIG. 9. In the example shown in FIG. 12, discharging is performed at timing t12, and thus step S12 in FIG. 9 is determined to be NO and the pause period ends.

When the required current (lines k11, k13) becomes equal to the Li deposition limit value (line k12) at timing t13, the permission period (t13 to t22) is set in the same manner as above. Since the SOC (line k14) at timing t13 is lower than $S_A$, the permission condition is satisfied. Charging restriction value X2 in the permission period is maintained at the Li deposition limit value at the permission starting point (timing t13). When the permission period ends at timing t22, then charging is stopped, and charging is not performed in the pause period after the stop of charging.

When the required current (lines k11, k13) becomes equal to the Li deposition limit value (line k12) at timing t15, the SOC (line k14) at timing t15 is not lower than $S_A$. Therefore, it is determined that the permission condition is not satisfied (NO at step S23 in FIG. 9), and thus the permission period is not set. During timing t15 to timing t16, the charging current (line k13) is controlled (restricted) to be equal to the Li deposition limit value (line k12), as in the battery controller in the comparative example (see FIG. 11).

According to the battery controller in the present example, lithium deposition is permitted in the permission period. This can increase the chance of charging and prolong the charging time, thus reducing the charging loss, compared to the battery controller in the comparative example.

Since the lithium deposited in the above-described permission period is dissolved in the pause period after a stop of charging, lithium (metallic lithium) does not remain on the anode surface of the target cell when the next charging is started. Therefore, in the battery controller in the present example, deterioration in battery performance due to lithium deposition is prevented.

In the above-described embodiment, the charging restriction value is maintained at a fixed value (permission starting value) in the permission period. However, this is not a limitation, and the charging restriction value may be variable in the permission period.

Figure 13:
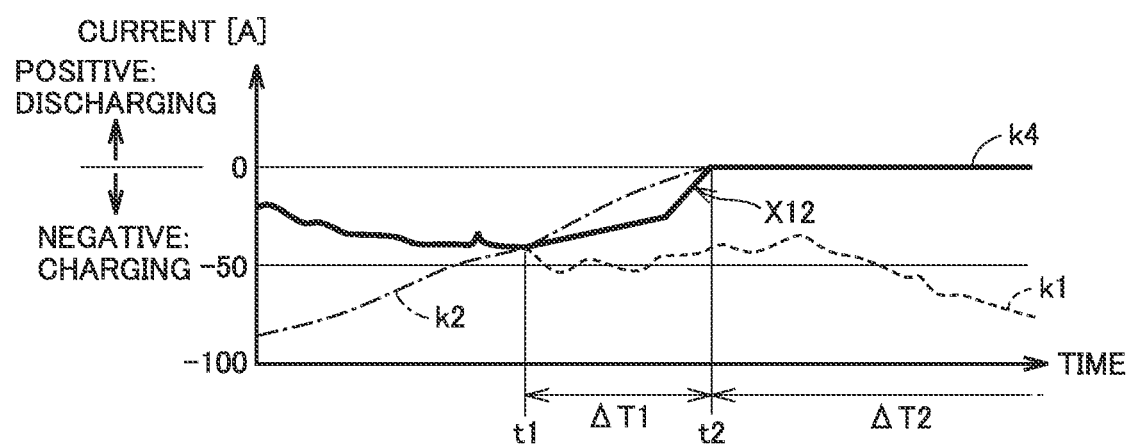
FIG. 13 shows a variation of the charging restriction value in the permission period shown in FIG. 2.

FIG. 13 shows a variation of the charging restriction value in the permission period shown in FIG. 2. With reference to FIG. 13, in the permission period (t1 to t2), charging restriction value X12 gradually changes closer to 0 from the permission starting point (timing t1) with the lapse of time. In the permission period, charging restriction value X12 is larger than the Li deposition limit value (line k2). That is, such charging restriction value X12 can relax the restriction of the charging current in the permission period. In the permission period, since the required current (line k1) is larger than charging restriction value X12, the charging current (line k4) is controlled to be equal to charging restriction value X12. Gradually decreasing charging restriction value X12 in the permission period in this way prevents inactivation of the deposited lithium in the permission period. However, the recovery rate of the regenerative electric power is higher when the charging restriction value is maintained in the permission period (see FIG. 2) than when the charging restriction value is made smaller in the permission period (see FIG. 13).

In the above-described embodiment, once permission time ΔT1 is set at step S31 in FIG. 9, permission time ΔT1 is not changed. However, this is not a limitation, and permission time ΔT1 may be changed during the permission period. For example, permission time ΔT1 may be variable depending on the value (e.g. the integrated value) of the charging current (or the required current) in the permission period. The method of setting permission time ΔT1 (and thus the permission period) is not limited to the method that uses ΔT1 determination information (FIG. 3), but may be any method.

In the above-described embodiment, the Li deposition limit value is set as the charging restriction value outside of the permission period (steps S22, S52 in FIG. 9). However, the charging control outside of the permission period is not limited to this. For example, a value smaller than the Li deposition limit value may be set as the charging restriction value.

Calculating the Li deposition limit value is not mandatory in ECU 300. For example, ECU 300 may externally acquire the Li deposition limit value via communication. Further, the information (e.g. ΔT1 determination information) stored in memory 302 in advance for use in the charging control may be prepared outside of ECU 300 (e.g. a server outside of vehicle 1), not inside of ECU 300 (e.g. memory 302), and ECU 300 may externally acquire the information via communication.

Although an embodiment of the present disclosure has been described, it is should be understood that the embodiment disclosed herein is by way of example in every respect and is not to be taken by way of limitation. The scope of the present disclosure is defined by the terms of the claims, and is intended to include any modification within the meaning and the scope equivalent to the terms of the claims.

What is claimed is:

1. A controller for a lithium-ion secondary battery, the controller being configured to control a charging current to the lithium-ion secondary battery so that lithium expected to dissolve after a stop of charging is permitted to deposit on an anode of the lithium-ion secondary battery, comprising:
a control device configured to control the charging current so that the charging current does not exceed a predetermined upper limit value; and
a setting device configured to set the upper limit value using a Li deposition limit value representing a maximum value of the charging current that does not cause deposition of lithium on the anode of the lithium-ion secondary battery, wherein
the control device is configured to, if a predetermined permission condition is satisfied, permit the lithium expected to dissolve after the stop of charging to deposit on the anode of the lithium-ion secondary battery by permitting the upper limit value to become larger than the Li deposition limit value in a predetermined permission period.

2. The controller for a lithium-ion secondary battery according to claim 1, wherein
the permission condition is satisfied if an SOC of the lithium-ion secondary battery is lower than a predetermined SOC value, and
the predetermined SOC value is not less than 90% and not more than 100%.

3. The controller for a lithium-ion secondary battery according to claim 2, wherein the control device is configured to stop charging at a timing at which the permission period ends, and configured not to perform charging until a predetermined time has elapsed from the stop of charging.

4. The controller for a lithium-ion secondary battery according to claim 1, wherein the permission period is a period from a permission starting point until a predetermined time has elapsed, the permission starting point being a timing at which the charging current becomes equal to the Li deposition limit value.

5. The controller for a lithium-ion secondary battery according to claim 4, wherein, in the permission period, the upper limit value is maintained at the Li deposition limit value at the permission starting point.

6. The controller for a lithium-ion secondary battery according to claim 4, wherein the predetermined time which defines a length of the permission period is determined using at least one of an environmental temperature, an SOC, and the charging current of the lithium-ion secondary battery at the permission starting point.

7. A vehicle comprising:
a drive wheel;
a motor generator mechanically connected to the drive wheel;
a lithium-ion secondary battery configured to be charged with regenerative electric power generated by the motor generator; and
a controller configured to control a charging current to the lithium-ion secondary battery,
the controller including
a control device configured to control the regenerative electric power so that the charging current does not exceed a predetermined upper limit value, and
a setting device configured to set the upper limit value using a Li deposition limit value representing a maximum value of the charging current that does not cause deposition of lithium on an anode of the lithium-ion secondary battery,
the control device being configured to, if a predetermined permission condition is satisfied, permit lithium expected to dissolve after a stop of charging to deposit on the anode of the lithium-ion secondary battery by permitting the upper limit value to become larger than the Li deposition limit value in a predetermined permission period.

* * * * *